United States Patent
Hong

[19]

[11] Patent Number: 6,103,070
[45] Date of Patent: Aug. 15, 2000

[54] POWERED SHIELD SOURCE FOR HIGH DENSITY PLASMA

[75] Inventor: Liubo Hong, San Jose, Calif.

[73] Assignee: Applied Materials, Inc., Santo Clara, Calif.

[21] Appl. No.: 08/856,423

[22] Filed: May 14, 1997

[51] Int. Cl.[7] .................................................. C23C 14/34
[52] U.S. Cl. .................................. 204/192.12; 118/723 I; 156/345; 427/569; 204/192.32; 204/298.06; 204/298.34
[58] Field of Search .......................... 204/298.11, 192.12, 204/298.12, 192.32, 298.06, 298.34; 118/723 I, 723 IR, 723 E; 156/345; 427/585, 569; 315/111.51, 111.21

[56] References Cited

U.S. PATENT DOCUMENTS

| | | | |
|---|---|---|---|
| 3,619,402 | 11/1971 | Wurm | 204/298.12 |
| 3,763,031 | 10/1973 | Scow et al. | |
| 4,336,118 | 6/1982 | Patten et al. | 204/192.12 |
| 4,362,632 | 12/1982 | Jacob | 204/298.06 |
| 4,568,845 | 2/1986 | Uehara | 310/13 |
| 4,626,312 | 12/1986 | Tracy | 156/345 |
| 4,661,228 | 4/1987 | Mintz | 204/192.25 |
| 4,716,491 | 12/1987 | Ohno et al. | 204/192.34 |
| 4,792,732 | 12/1988 | O'Loughlin | 315/334 |
| 4,842,703 | 6/1989 | Class et al. | 204/298.18 |
| 4,844,775 | 7/1989 | Keeble | 118/50.1 |
| 4,865,712 | 9/1989 | Mintz | 204/192.12 |
| 4,871,421 | 10/1989 | Ogle et al. | 156/345 |
| 4,918,031 | 4/1990 | Flamm et al. | 204/192.25 |
| 4,925,542 | 5/1990 | Kidd | 427/531 |
| 4,941,951 | 7/1990 | Matsuoka et al. | 204/298.12 |
| 4,948,458 | 8/1990 | Ogle | 118/50.1 |
| 4,990,229 | 2/1991 | Campbell et al. | 204/298.06 |
| 4,999,096 | 3/1991 | Nihei et al. | 204/192.15 |
| 5,065,698 | 11/1991 | Koike | 118/723 R |
| 5,091,049 | 2/1992 | Campbell et al. | 216/37 |
| 5,122,251 | 6/1992 | Campbell et al. | 204/298.06 |
| 5,135,629 | 8/1992 | Sawada et al. | 315/111.21 |
| 5,146,137 | 9/1992 | Gesche et al. | 118/111.21 |
| 5,175,608 | 12/1992 | Nihei et al. | 257/751 |
| 5,178,739 | 1/1993 | Barnes et al. | |
| 5,206,516 | 4/1993 | Keller et al. | 250/492.7 |

(List continued on next page.)

FOREIGN PATENT DOCUMENTS

| | | |
|---|---|---|
| 0520519 | 12/1992 | European Pat. Off. |
| 0607797 | 1/1994 | European Pat. Off. |
| 0774886 | 5/1997 | European Pat. Off. |
| 1905058 | 8/1970 | Germany. |
| 56-047562 | 4/1981 | Japan. |
| 59-190363 | 10/1984 | Japan. |
| 61-190070 | 8/1986 | Japan. |
| 6232055 | 8/1994 | Japan. |
| 6283470 | 10/1994 | Japan. |
| 7176398 | 7/1995 | Japan. |
| 7176399 | 7/1995 | Japan. |
| 8153712 | 6/1996 | Japan. |
| 8288259 | 11/1996 | Japan. |
| 2162365 | 1/1986 | United Kingdom. |
| 2231197 | 11/1990 | United Kingdom. |
| WO860623 | 11/1986 | WIPO. |
| 92079696 | 5/1992 | WIPO. |

OTHER PUBLICATIONS

U.S. patent application Ser. No. 08/647,184, filed May 9, 1996.

U.S. patent application Ser. No. 07/954,860, filed Sep. 30, 1992.

(List continued on next page.)

*Primary Examiner*—Nam Nguyen
*Attorney, Agent, or Firm*—Konrad Raynes & Victor LLP

[57] ABSTRACT

An insulative inter-turn shield positioned at the channel in coil windings to confine the plasma generated by energy radiated by the coil windings in an apparatus for sputtering material onto a workpiece. The insulative shield can prevent the escape of the plasma through the channel between the windings to thereby improve the effectiveness of the sputtering process. In addition, the shield can also block the passage of sputtered material through the channel, preventing the contamination of the vacuum chamber.

38 Claims, 6 Drawing Sheets

U.S. PATENT DOCUMENTS

| | | |
|---|---|---|
| 5,225,740 | 7/1993 | Ohkawa .............................. 204/298.37 |
| 5,231,334 | 7/1993 | Paranjpe .................................. 156/345 |
| 5,234,529 | 8/1993 | Johnson . |
| 5,234,560 | 8/1993 | Kadlec et al. ...................... 204/192.12 |
| 5,241,245 | 8/1993 | Barnes et al. ...................... 315/111.41 |
| 5,280,154 | 1/1994 | Cuomo et al. ........................... 156/345 |
| 5,304,279 | 4/1994 | Coultas et al. .......................... 156/345 |
| 5,312,717 | 5/1994 | Sachdev et al. ........................ 430/313 |
| 5,346,578 | 9/1994 | Benzing et al. ......................... 156/345 |
| 5,361,016 | 11/1994 | Ohkawa et al. ................... 315/111.41 |
| 5,366,585 | 11/1994 | Robertson et al. . |
| 5,366,590 | 11/1994 | Kadomura ............................... 438/723 |
| 5,368,685 | 11/1994 | Kumihashi et al. ..................... 156/345 |
| 5,397,962 | 3/1995 | Moslehi ............................. 315/111.51 |
| 5,401,350 | 3/1995 | Patrick ............................... 204/298.06 |
| 5,404,079 | 4/1995 | Ohkuni et al. ..................... 315/111.81 |
| 5,417,834 | 5/1995 | Latz ................... 204/298.11 |
| 5,418,431 | 5/1995 | Williamson et al. ............ 118/723 AN |
| 5,421,891 | 6/1995 | Campbell et al. ................... 118/723 R |
| 5,429,070 | 7/1995 | Campbell et al. ................... 118/723 R |
| 5,429,710 | 7/1995 | Akiba et al. ............................. 438/714 |
| 5,429,995 | 7/1995 | Nishiyama et al. ..................... 438/788 |
| 5,430,355 | 7/1995 | Paranjpe ............................. 315/111.21 |
| 5,431,799 | 7/1995 | Mosely et al. . |
| 5,503,676 | 4/1996 | Shufflebotham et al. .............. 156/345 |
| 5,560,776 | 10/1996 | Sugai et al. . |
| 5,569,363 | 10/1996 | Bayer et al. ........................ 204/298.11 |
| 5,573,595 | 11/1996 | Dible .................................... 118/723 I |
| 5,690,795 | 11/1997 | Rosenstein et al. ............... 204/298.11 |

OTHER PUBLICATIONS

U.S. Ser. No. 09/049,839 (Atty. Dkt. 938.D1).

U.S. Ser. No. 09/049,276 (Atty. Dkt. 938.D2).

U.S. Ser. No. 08/853,024 (Atty. Dkt. 1186.P1).

European Search Report, App. No. 97303124.8, dated Aug. 22, 1997.

Search Report in EPO 97307864.5 dated Jul. 31, 1998.

M. Yamashita, "Sputter Type High Frequency Ion Source for Ion Beam Deposition Apparatus," *Jap. J. Appl. Phys.*, vol. 26, pp. 721–727, 1987.

M. Yamashita, "Fundamental Characteristics of Built–in High Frequency Coil Type Sputtering Apparatus," *J. Vac. Sci. Technol.*, vol. A7, pp. 151–158, 1989.

S.M. Rossnagel et al., "Metal Ion Deposition from Ionized Magnetron Sputtering Discharge," *J. Vac. Sci. Technol.*, vol. B12, pp. 449–453, 1994.

S.M. Rossnagel et al., "Magnetron Sputter Deposition with High Levels of Metal Ionization," *Appl. Phys. Lett.*, vol. 63, pp. 3285–3287, 1993.

S.M. Rossnagel, et al., "Filling Dual Damascene Interconnect Structures with AlCu and Cu Using Ionized Magnetron Deposition," *J. Vac. Sci. Technol.*, vol. B13, pp. 125–129, 1995.

Y–W. Kim et al., "Ionized Sputter Deposition of AlCu: Film Microstructure and Chemistry," *J. Vac. Sci. Technol.*, vol. A12, pp. 3169–3175, 1994.

J. Hopwood et al., "Mechanisms for Highly Ionized Magnetron Sputtering," *J. Appl. Phys.*, vol. 78, pp. 758–765, 1995.

P. Kidd, "A Magnetically Confined and ECR Heated Plasma Machine for Coating and Ion Surface Modification Use," *J. Vac. Sci. Technol.*, vol. A9, pp. 466–473, 1991.

W.M. Holber, et al., "Copper Deposition by Electron Cyclotron Resonance Plasma," *J. Vac. Sci. Technol.*, vol. A11, pp. 2903–2910, 1993.

S.M. Rossnagel, "Directional and Ionized Sputter Deposition for Microelectronics Applications," *Proc. of 3rd ISSP (Tokyo)*, pp. 253–260, 1995.

M. Matsuoka et al., Dense Plasma Production and Film Deposition by New High–Rate Sputtering Using an Electric Mirror, *J. Vac. Sci. Technol.*, A 7 (4), 2652–2657, Jul./Aug. 1989.

U.S. patent application Ser. No. 08/680,335, filed Jul. 10, 1996 (Atty. Dk. 1390–CIP/PVD/DV).

N. Jiwari et al., "Helicon wave plasma reactor employing single–loop antenna," *J. of Vac. Sci. Technol.*, A 12(4), pp. 1322–1327, Jul./Aug. 1994.

Search report dated Feb. 27, 1997, EPC application No. 96308251.6.

U.S. patent application Ser. No. 08/677,588, filed Jul. 9, 1996, abandoned (Atty. Dk. 1402/PVD/DV).

U.S. patent application Ser. No. 08/644,096, filed May 10, 1996, abandoned (Aty. Dk. 1390/PVD/DV).

U.S. patent application Ser. No. 08/461,575, filed Sep. 30, 1992 (Atty. Dk. 364.F1).

U.S. patent application Ser. No. 08/310,617 now U.S. Pat 5589224.

U.S. patent application Ser. No. 08/567,601 now U.S. Pat 5803977.

U.S. patent application Ser. No. 08/647,182, filed May 9, 1996 (Atty. Dk. 1186).

U.S. patent application Ser. No. 08/559,345, filed Nov. 15, 1995 (Aty. Dk. 938/PVD/DV).

U.S. patent application Ser. No. 08/733,620, filed Oct. 17, 1996 (Attorney Docket # 1457/PVD/DV).

U.S. patent application Ser. No. 08/741,708, filed Oct. 31, 1996 (Attorney Docket # 1590/PVD/DV).

U.S. patent application Ser. No. 08/559,345, filed Nov. 15, 1995 (Aty. Dk. 938).

U.S. patent application Ser. No. 08/730,722, filed Oct. 8, 1996 (Aty. Dk. 1207/MD/PVD/DV).

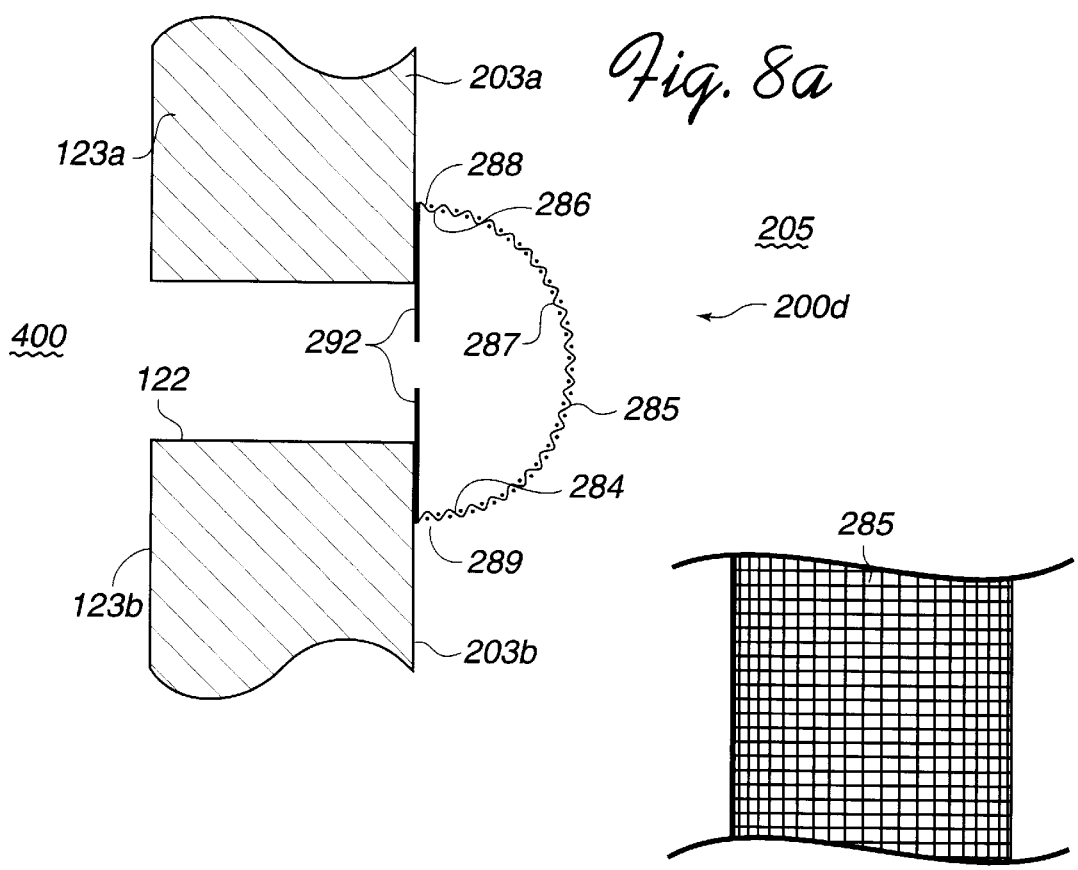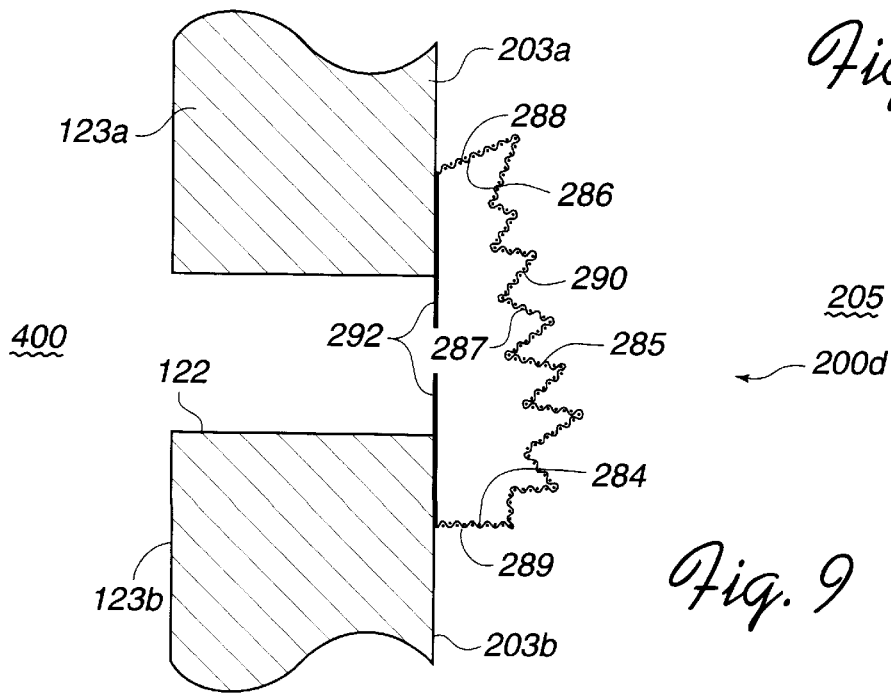

POWERED SHIELD SOURCE FOR HIGH DENSITY PLASMA

FIELD OF THE INVENTION

The present invention relates to plasma generators, and more particularly, to a method and apparatus for confining sputtered material and the plasma generated by the plasma generators during the fabrication of semiconductor devices.

BACKGROUND OF THE INVENTION

Low density plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition to process, a plasma is produced in the vicinity of a sputter target material which is negatively biased. Ions created adjacent to the target impact the surface of the target to dislodge, i.e., "sputter" material from the target. The sputtered materials are then transported and deposited on the surface of the semiconductor wafer.

Sputtered material has a tendency to travel in straight line paths from the target to the substrate being deposited, at angles which are oblique to the surface of the substrate. As a consequence, materials deposited in etched trenches and holes of semiconductor devices having trenches or holes with a high depth to width aspect ratio, can bridge over causing undesirable cavities in the deposition layer. To prevent such cavities, the sputtered material can be redirected into substantially vertical paths between the target and the substrate by negatively charging the substrate to position vertically oriented electric fields adjacent the substrate if the sputtered material is sufficiently ionized by the plasma. However, material sputtered in a low density plasma often has an ionization degree of less than 1% which is usually insufficient to avoid the formation of an excessive number of cavities. Accordingly, it is desirable to increase the density of the plasma to increase the ionization rate of the sputtered material in order to decrease the formation of unwanted cavities in the deposition layer. As used herein, the term "dense plasma" is intended to refer to one that has a high electron and ion density.

There are several known techniques for exciting a plasma with RF fields including capacitive coupling, inductive coupling and wave heating. In a standard inductively coupled plasma (ICP) generator, RF current passing through a coil surrounding the plasma induces electromagnetic currents in the plasma. These currents heat the conducting plasma by ohmic heating, so that it is sustained in a steady state. As shown in U.S. Pat. No. 4,362,632, for example, current through a coil is supplied by an RF generator coupled to the coil through an impedance matching network, such that the coil acts as the first windings of a transformer. The plasma acts as a single turn second winding of a transformer.

In a number of deposition chambers such as a physical vapor deposition chamber, the chamber walls are often formed of a conductive metal such as stainless steel. Because of the conductivity of the chamber walls, it is often necessary to place the antenna coils or electrodes within the chamber itself because the conducting chamber walls would block or substantially attenuate the electromagnetic energy radiating from the antenna. As a result, the coil and its supporting structures are directly exposed to the deposition flux and energetic plasma particles. This is a potential source of contamination of the film deposited on the wafer, and is undesirable.

To protect the coils, shields made from nonconducting materials, such as ceramics, can be placed in front of the coil. However, many deposition processes involve deposition of conductive materials such as aluminum on the electronic device being fabricated. Because the conductive material will coat the ceramic shield, it will soon become conducting, thus again substantially attenuating penetration of electromagnetic radiation into the plasma.

The generation of unwanted particulate matter can also be reduced by using a conductive metal shield as a coil as disclosed in copending application Ser. No. 08/730,722, filed Oct. 8, 1996 (pending Attorney Docket No. 1207/PVD/DV) entitled "Active Shield for Generating a Plasma for Sputtering" by Sergio Edelstein and Mani Subramani, which is assigned to the assignee of the present application and is incorporated herein by reference in its entirety. The conductive coil-shield is coupled to an RF source such that the coil-shield itself inductively couples electromagnetic energy to a plasma. Such an arrangement is believed to avoid attenuation of the RF power while at the same time substantially reducing the generation of contaminating particles from the coil-shield.

However, coil-shield designs as described in the aforementioned application have one or more channels in the wall of the coil-shield to separate portions of the coil-shield wall into one or more individual windings. However, sputtered material can pass through the coil-shield channels. To prevent such sputtered material from contaminating the vacuum chamber of the apparatus, it has been proposed to provide another conductive metal shield wall spaced behind the coil-shield channels. However, such an additional shield wall can increase the size of the chamber. In clean room environment where space is at a premium, the chamber should be as compact as possible. Furthermore, a second conductive metal shield wall can cause power losses due to eddy currents in the wall.

SUMMARY OF THE PREFERRED EMBODIMENTS

It is an object of the present invention to provide an improved method and apparatus for depositing material onto a workpiece or for etching a workpiece, obviating, for practical purposes, the above-mentioned limitations. These and other objects and advantages are achieved by, in accordance with one aspect of the invention, an ionization apparatus having coil windings, a channel between the coil windings and an insulative inter-turn shield positioned at the channel to confine the plasma generated by energy radiated by the coil windings. The insulative shield can prevent the escape of the plasma through the channel between the windings to thereby improve the effectiveness of the ionization process. In addition, the shield can also block the passage of sputtered or other deposition material through the channel, preventing the contamination of the vacuum chamber.

In the illustrated embodiment, the insulative inter-turn shield comprises an insulating member which may be attached directly to the coil winding, positioned either in front of or behind the channel or even within the chamber itself. Such an arrangement can substantially reduce the size of the insulating shield members.

In another feature of the present invention, the insulative shield is constructed so as to prevent the formation of a complete electrical path from one adjacent coil winding to another adjacent coil winding by the deposition of conductive deposition material onto the insulating member. In the illustrated embodiment, the insulative shield has an opening which prevents adjacent windings from being shorted together by the deposition of conductive metal onto the insulative shield between the windings.

BRIEF DESCRIPTION OF THE DRAWINGS

FIG. 8a is a schematic cross-sectional view of an inter-turn shield in accordance with a fifth embodiment of the present invention.

FIG. 8b is a frontal view of an inter-turn shield in accordance with the fifth embodiment of the present invention.

FIG. 9 is a schematic cross-sectional view of an inter-turn shield in accordance with a sixth embodiment of the present invention.

DETAILED DESCRIPTION OF THE DRAWINGS

Figure 1:
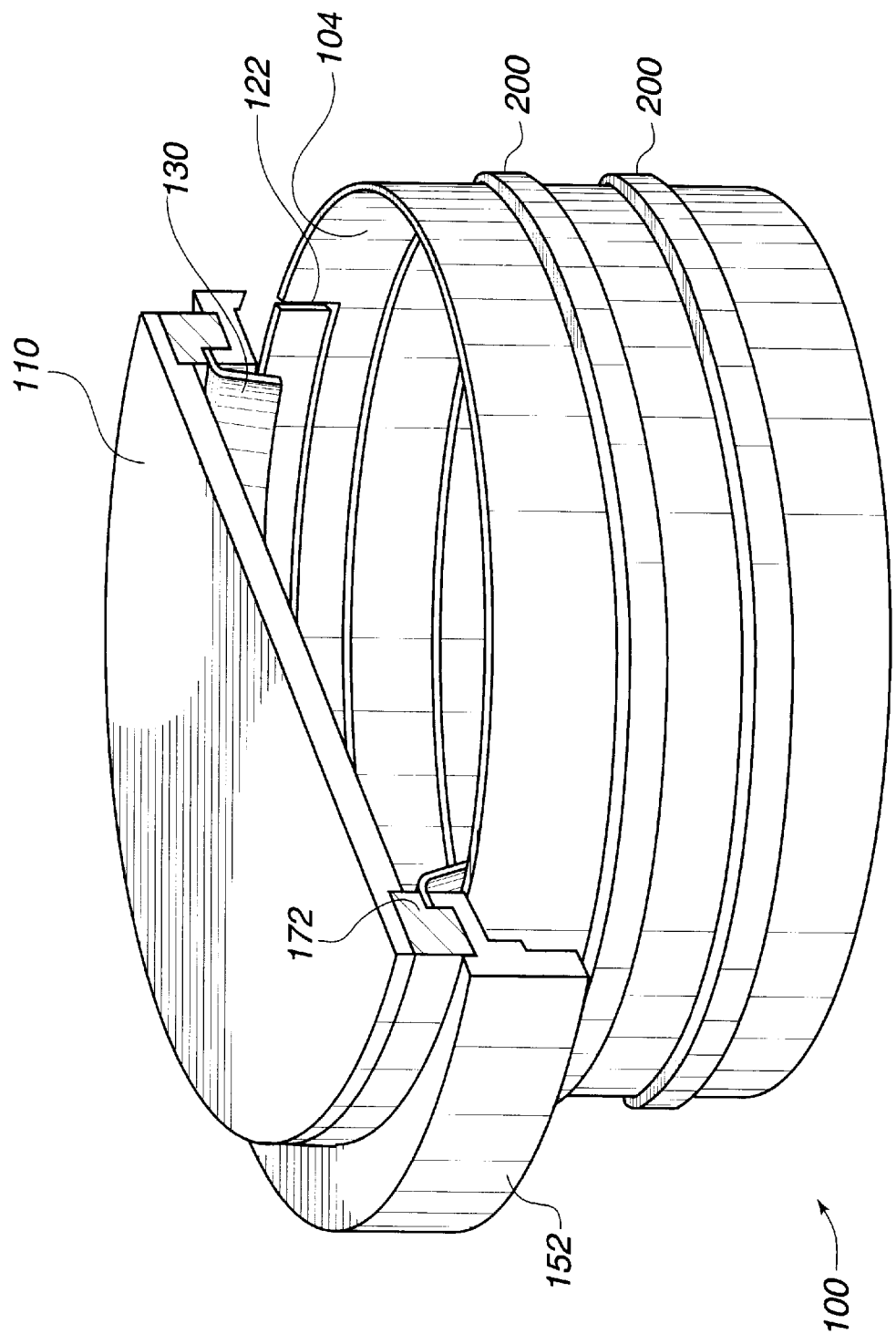
FIG. 1 is a perspective, partial cross-sectional view of a plasma generating chamber in accordance with one embodiment of the present invention.
Figure 2:
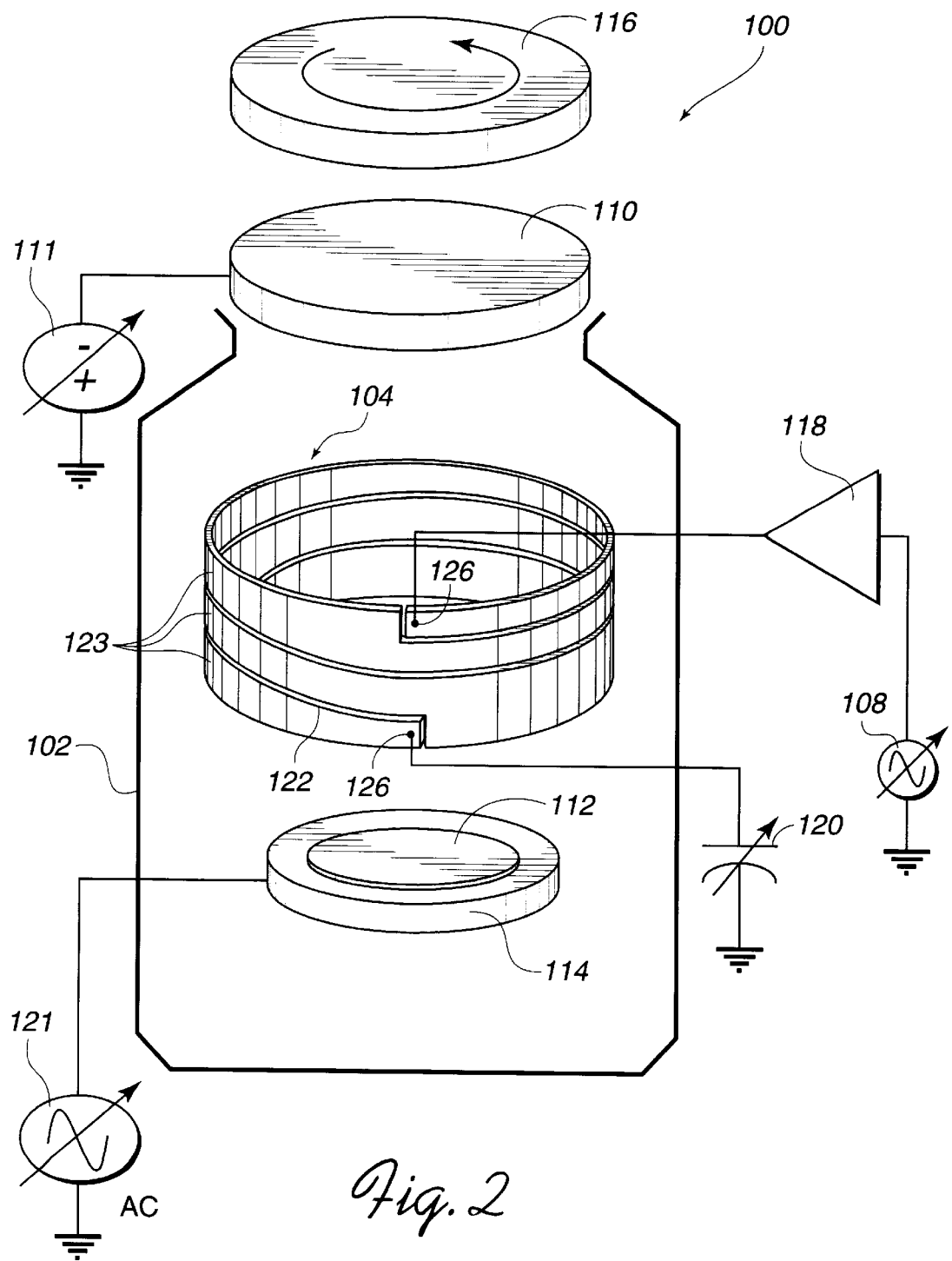
FIG. 2 is a schematic diagram of the electrical interconnections to the plasma generating chamber of FIG. 1.

Referring first to FIGS. 1 and 2, a plasma sputter deposition system comprises a substantially cylindrical plasma chamber 100 which is received in a vacuum chamber 102 (shown schematically in FIG. 2). The plasma chamber 100 has an inner shield 104 which is formed into a multi-turn coil and is insulatively carried internally by the vacuum chamber 102. As explained in greater detail below, in accordance with one aspect of the present invention, the coil-shield 104 has an insulative inter-turn shield 200 which confines the plasma and sputtered material within the coil-shield 104 and shield 200.

An ion flux strikes a negatively biased target 110 positioned at the top of the chamber 102. The target 110 is negatively biased by a DC power source 111. The ions eject material from the target 110 onto a substrate 112 which may be a wafer or other workpiece which is supported by a pedestal 114 at the bottom of the deposition system 100. A rotating magnetron magnet assembly 116 provided above the target 110 produces magnetic fields which sweep over the face of the target 110 to promote uniform erosion of the target.

Radio frequency (RF) energy from an RF generator 108 is radiated from the coil-shield 104 into the interior of the deposition system 100, which energizes a plasma within the deposition system 100. The atoms of material ejected from the target 110 are in turn ionized by the plasma being energized by the coil-shield 104 which is inductively coupled to the plasma. The RF generator 108 is preferably coupled to the coil-shield 104 through an amplifier and impedance matching network 118. The other end of the coil-shield 104 is coupled to ground, preferably through a capacitor 120 which may be a variable capacitor. The ionized deposition material is attracted to the substrate 112 and forms a deposition layer thereon. The pedestal 114 may be negatively biased by an AC (or DC or RF) source 121 so as to externally bias the substrate 112. As set forth in greater detail in copending application Ser. No. 08/677,588, filed Jul. 9, 1996 (Attorney Docket No. 1402/PVD/DV) abandoned, entitled "Method for Providing Full-Face High Density Plasma Deposition" by Ken Ngan, Simon Hui and Gongda Yao, which is assigned to the assignee of the present application and is incorporated herein by reference in its entirety, external biasing of the substrate 112 may optionally be eliminated.

As explained in greater detail in copending application Ser. No. 08/730,722, filed Oct. 8, 1996 (Attorney Docket No. 1207/PVD/DV) entitled "Active Shield for Generating a Plasma for Sputtering" by Sergio Edelstein and Mani Subramani, which is assigned to the assignee of the present application and is incorporated herein by reference in its entirety, the coil-shield 104 has a helix-shaped design which permits the coil-shield 104 to function as a multi-turn coil. As a result, the amount of current necessary to couple RF energy into the plasma is reduced as compared to that required by a single turn coil. By reducing the current carrying requirements of the chamber components, the design can be simplified and costs reduced.

To enable the coil-shield 104 to function as a multi-turn coil, a thin channel 122 (preferably approximately 3–12 mm (approximately ⅛ to ½ inches) in width) cut completely through the wall of the shield 104 is formed in a helix shape so that the resultant coil-shield 104 comprises a continuous strip of conductive material wound in a helix. Each turn or winding 123 of the coil-shield 104 is separated from the adjacent turn by a gap 125 (FIG. 3) provided by the continuous channel 122. The overall shape of the coil-shield 104 is generally cylindrical but other shapes may be used depending upon the application. Also, the coil-shield may be assembled from separate pieces fastened or joined together.

In accordance with one aspect of the present invention, the coil inter-turn shield 200 (FIGS. 1 and 3) is attached to the coil-shield 104 at the channel 122 to confine the plasma within the coil-shield 104. The coil inter-turn shield 200 prevents the plasma ions from escaping through the channel 122 provided to form the windings of the coil. By confining the plasma within the coil-shield 104, the density of the plasma in the ionization area between the target 110 and the substrate may be maintained at a relatively high level to improve the ionization rate of the material being sputtered from the target 110. In addition, as described in greater detail below, the coil inter-turn shield 200 blocks the sputtered material from passing through the channel 122. In this manner, the interior surfaces of the vacuum chamber 102 are protected from the deposition material without the need for a separate shield between the coil-shield 104 and the walls of the vacuum chamber 102. Furthermore, as described in greater detail below, the coil inter-turn shield 200 has a labyrinth structure which prevents a conducting path from being formed by material deposited on the coil inter-turn shield 200, which could short one winding to another.

Although the illustrated embodiment is described in connection with a sputter deposition apparatus, it is recognized that the present invention may be used in a variety of other ionization apparatus. For example, the present invention is applicable to semiconductor manufacturing processes having other deposition sources such as chemical vapor deposition and to other ionization processes such as etching.

Figure 3:
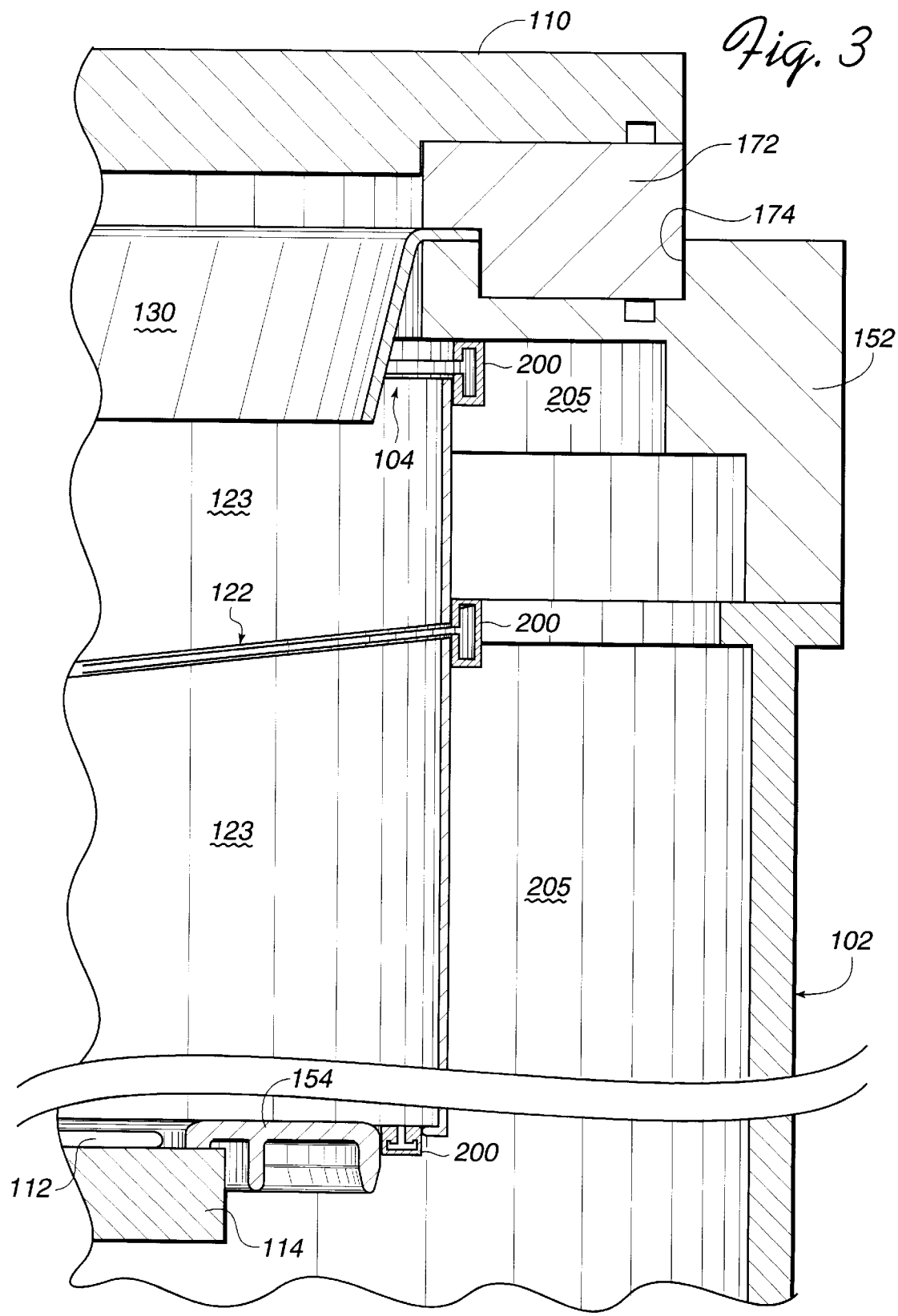
FIG. 3 is a schematic partial cross-sectional view of the plasma generating chamber of FIG. 1 shown installed in a vacuum chamber.
Figure 4:
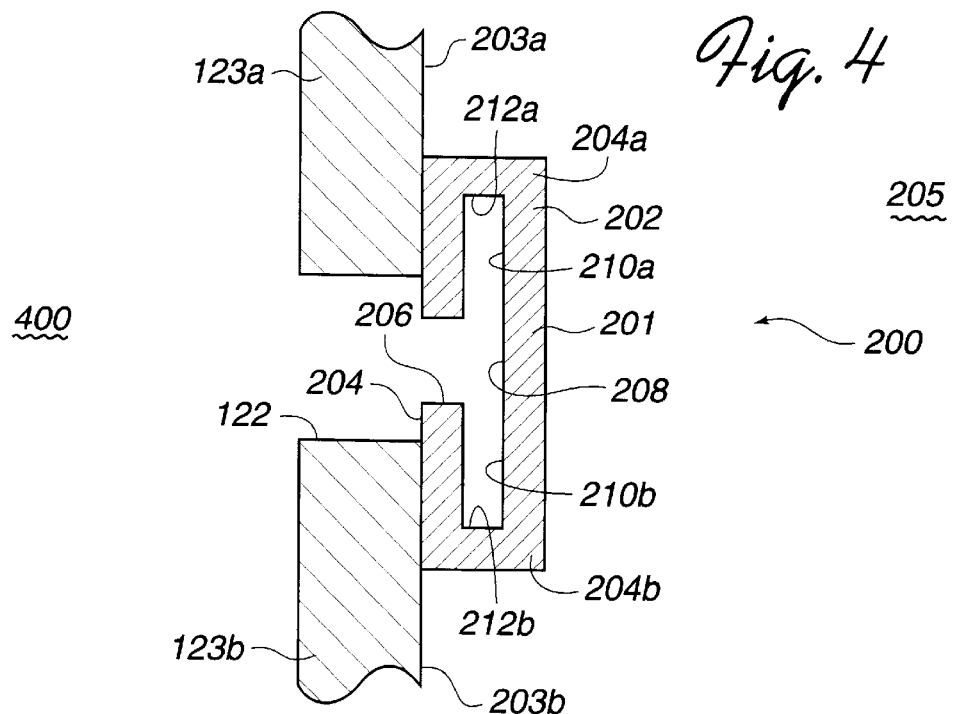
FIG. 4 is a schematic cross-sectional view of an insulative inter-turn shield in accordance with a first embodiment of the present invention.

FIG. 4 shows a cross-sectional view of the coil inter-turn shield 200 and the coil windings 123a and 123b in accordance with a first embodiment of the present invention. The coil inter-turn shield 200 of this embodiment comprises a single insulating member 201. To confine the plasma in the ionization area 400 and block the passage of deposition material, the insulating member 201 has a longitudinal body 202 which is attached behind adjacent coil windings 123a and 123b, so that the vertical width of the body 202 straddles the channel 122 between the adjacent windings. The upper portion 204a of the body 202 of the insulating member 201 is sealingly attached to a rear surface 203a of the upper coil winding 123a and the lower portion 204b of the body 202 is sealingly attached to a rear surface 203b of the lower coil winding 123b. The body 202 completely blocks the passage of any deposition material or plasma ions to the area 205 behind the coil-shield 104. The body 202 is preferably fabricated from a solid, electrically insulative material which is heat resistant. One suitable material is ceramic. Other types of materials such as MACOR® may be used as well. The shield 200 may be fastened to the coil-shield windings by any suitable fasteners including screw fasteners. Besides spanning the gap between adjacent windings, the shield 200 may also be utilized to span other gaps such as the gap between the coil-shield and the pedestal clamp 154 as shown in FIG. 3.

As discussed above, the material being deposited is often a conductive metal such as aluminum, copper, titanium and the like. In accordance with another aspect of the present invention, the face 204 of the body 202 facing the ionization area 400 has an opening 206 to a cavity 208 which defines substantially vertical internal upper and lower labyrinthine passageways 210a and 210b, respectively. The opening 206 and passageways 210a and 210b prevent or are resistant to the formation of a complete conducting path by the deposition of conducting deposition materials onto the member 201. A complete conducting path of sputtered material across the insulating member 201 could short the coil windings 123a and 123b together, reducing the effectiveness of the ionizing process.

The opening 206 of the insulating member 201 preferably has a smaller vertical width than the vertical width of the cavity 208 so that the extreme upper and lower portions 212a and 212b of the cavity passageways 210a and 210b, respectively, are not within the line of sight of the opening 206. As a consequence, the small vertical width of the opening 206 greatly reduces the angle of admittance into the cavity 208 for sputtered material particles that travel in a straight path, especially into the upper and lower portions of the cavity 208. Because most of sputtered material particles travel in straight line paths (before colliding with another particle or ion), very little if any of the deposition material reaches the extreme upper and lower portions 212a and 212b of the cavity passageways 210a and 210b, respectively. This is particularly true for the upper passageway portion 212a because the deposition material tends to travel in a generally downward direction rather than upward. Thus, although sputtered material can pass through the opening 206, the reduction of the angle of admittance into the cavity 208 significantly limits the deposition of sputtered material, especially within the upper and lower portions 212a and 212b of the cavity 208. Because the chance of sputtered material particles being deposited on the upper and lower portions of the cavity 208 is greatly reduced, the formation of a complete conducting path of sputtered material can be significantly retarded, averting or at least significantly delaying for many depositions, short-circuiting of the coil windings 123a and 123b.

For some applications, it may be desirable to sputter deposit a coating of deposition material onto the front face of the shield 200 and coil-shield prior to depositing material onto the first wafer after the shield 200 is first installed. Such a pre-coating may provide improved adherence for subsequently deposited coatings to reduce the generation of particulates.

Figure 5:
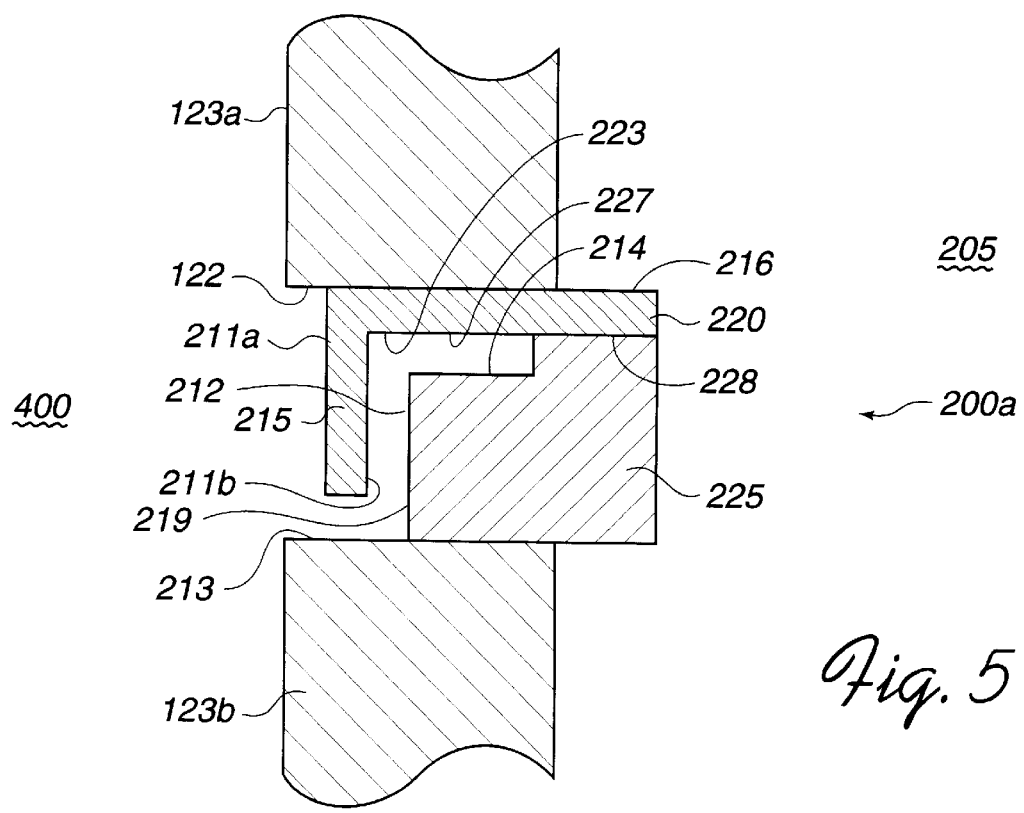
FIG. 5 is a schematic cross-sectional view of insulative inter-turn shield in accordance with a second embodiment of the present invention.

FIG. 5 shows a cross-sectional view of a coil inter-turn shield 200a in accordance with a second embodiment of the present invention. The coil inter-turn shield 200a is similar to the coil inter-turn shield 200 of FIG. 4 except that the coil inter-turn shield 200a is sealingly disposed within the channel 122 between the windings 123a and 123b instead of being disposed behind the windings 123a and 123b like the coil inter-turn shield 200 of FIG. 4. Because the coil inter-turn shield 200a is disposed within the channel 122, the coil inter-turn shield 200a can provide greater structural support to the coil windings 123a and 123b.

Also, in the second embodiment, the coil inter-turn shield 200a comprises two insulating members 220 and 225 which are assembled together to form a shield to confine the plasma within the coil-shield 104 and to prevent the plasma ions and sputtered material from escaping through the channel 122. By comparison, the coil inter-turn shield 200 has just one unitary insulating member as shown in FIG. 4. Using two assembled insulating members instead of one insulating member offers certain advantages. For example, it is often easier, and therefore often cheaper, to manufacture two separate but relatively simpler pieces of insulating members to be assembled together rather than manufacture one relatively complex insulating member. This is particularly true if the insulating members are made of materials that are difficult to machine or cast, such as ceramic. As shown in FIG. 5, the insulating member 220 generally has a relatively simple "L" cross-sectional shape and the insulating member 225 generally has a relatively simple and generally rectangular cross-sectional shape. However, as described below, these two relatively simple pieces 220 and 225 may be assembled together with appropriate fasteners such as screw fasteners to form more complicated openings, cavities and labyrinthian structures.

The insulating member 220 has a top portion 216 and a front flange portion 215. The top portion 216 is sealingly attached to the bottom surface of the winding 123a and is sealingly stacked on the top surface 228 of the insulating member 225. A front surface 211a of the flange portion 215 faces the ionization area 400, and the end of the flange portion 215 is spaced from the top surface of the coil winding 123b to define an opening 213. A back surface 211b of the flange portion 215 is spaced from a front surface 212 of the insulating member 225 to define a vertical passageway 219 between the insulating members 220 and 225, communicating with the opening 213.

The bottom surface of the insulating member 225 is sealingly attached to the top surface of the winding 123b. The top surface of the insulating member 225 is notched to define a recessed surface 214 spaced from the bottom surface 223 of the top portion 216 of the insulating member 220 to form a horizontal passageway 227 between the two insulating members 220 and 225. The horizontal passageway 227 is coupled to the vertical passageway 219 to form a labyrinthian passageway between the two insulating members 220 and 225 to prevent the formation of a complete conducting path by the deposition of conducting sputtered materials onto the insulating members 220 and 225. It is believed that a width of 1.5 mm or less for the opening 213 will work well in preventing the formation of a conducting path of sputtered material.

Figure 6:
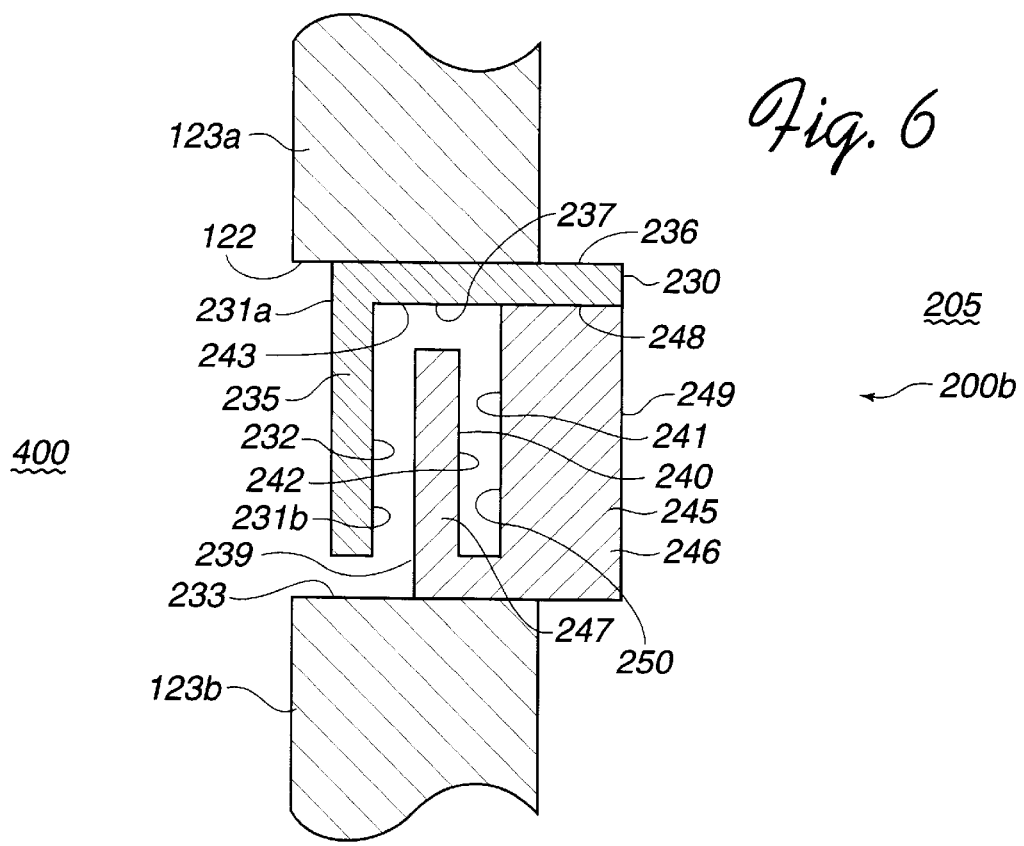
FIG. 6 is a schematic cross-sectional view of inter-turn shield in accordance with a third embodiment of the present invention.

FIG. 6 shows a cross-sectional view of a coil inter-turn shield 200b in accordance with a third embodiment of the present invention. The coil inter-turn shield 200b is similar to the coil inter-turn shield 200a of FIG. 5 in that the coil inter-turn shield 200b is also sealingly disposed within the channel 122 and is also comprised of two insulating members 230 and 245. However, the coil inter-turn shields 200b have insulating members 230 and 245 that are shaped differently from the insulating members 220 and 225 of the coil inter-turn shields 200a, and the insulating members 230 and 245 of the coil inter-turn shield 200b assemble to form openings, cavities and labyrinthian structures of somewhat different shape from the ones formed by the insulating members 220 and 225 of the coil inter-turn shield 200a.

As shown in FIG. 6, the insulating member 230 generally has a relatively simple "L" cross-sectional shape like the insulating member 220 of FIG. 5. The insulating member 230 has a top portion 236 and a front flange portion 235. The top portion 236 is sealingly attached to the bottom surface of the winding 123a and is sealingly stacked on the top surface 248 of the insulating member 245. A front surface 231a of the flange portion 235 faces the ionization area 400, and the end of the flange portion 235 is spaced from the top surface of the coil winding 123b to define an opening 233. A back surface 231b of the flange portion 235 is spaced from a front surface 239 of the insulating member 245 to define a vertical passageway 232 between the insulating members 230 and 245. The opening 233 leads into the vertical passageway 232.

The bottom surface of the insulating member 245 is sealingly attached to the top surface of the winding 123b. The insulating member 245 has a generally rectangular shaped portion 246 with a surface 249 facing the area 205 behind the coil-shield 200b and a surface 241 facing the surface 231b of the insulating member 230. The insulating member 245 also has an "L" cross-sectional shaped flange portion 247 attached to the lower end of the surface 241. The flange portion 247 has the front surface 239 facing the ionization area 400 and a back surface 242 facing the surface 241 of the rectangular portion 246. A top surface 240 of the flange portion 247 is spaced from a bottom surface 243 of the top portion 236 of the insulating member 230 to form a horizontal passageway 237 which is coupled to the vertical passageway 232. The back surface 242 of the flange portion 247 is spaced from the surface 241 of the rectangular portion 246 to define a vertical passageway 250 which is coupled to the horizontal passageway 237. The upper portion of the vertical passageway 232, the horizontal passageway 237 and the upper portion of the vertical passageway 250 form a generally rectangular cavity bordered by the surfaces 231b, 243, 241 and 240. The passageways 232, 237 and 250 are all coupled together to form a labyrinthian passageway between the two insulating members 230 and 245 to prevent the formation of a complete conducting path by the deposition of conducting sputtered materials on the insulating members 230 and 245.

Figure 7:
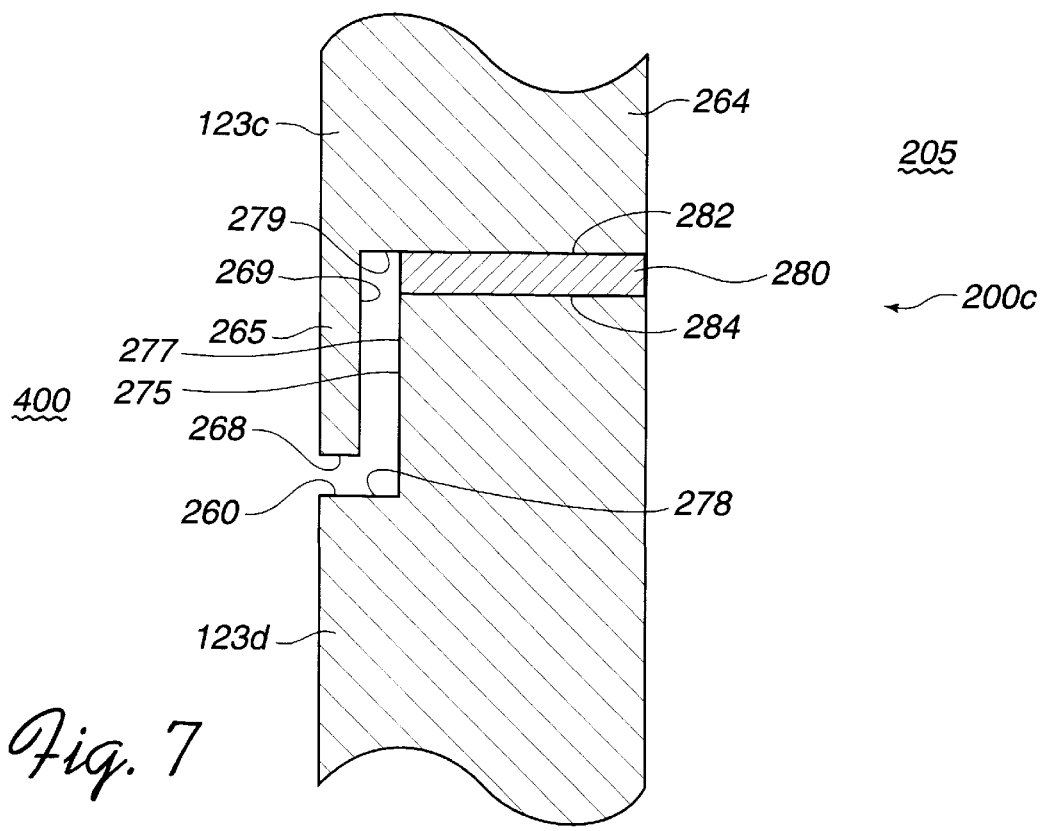
FIG. 7 is a schematic cross-sectional view of an inter-turn shield and coil windings in accordance with a fourth embodiment of the present invention.

FIG. 7 shows a cross-sectional view of a coil inter-turn shield 200c in accordance with a fourth embodiment of the present invention. The coil inter-turn shield 200c is different from the previous coil inter-turn shields 200, 200a and 200b in FIGS. 4–6 in that portions of coil windings 123c and 123d are used as part of the coil inter-turn shield 200c in addition to an insulating member 280. In other words, the coil inter-turn shield 200c comprises portions of the coil windings 123c and 123d and the insulating member 280 which are assembled together to form a coil inter-turn shield 200c to confine the plasma and to prevent the escape of the plasma ions and sputtered material through the channel 122. Using portions of the coil windings 123c and 123d as part of the coil inter-turn shield 200c offers certain advantages over the previous coil inter-turn shields 200, 200a and 200b in FIGS. 4–6. For example, fewer insulating members can be used to form a coil inter-turn shield since portions of the coil windings are used to form the coil inter-turn shield, and relatively simpler pieces of insulating members can be used to form the coil inter-turn shield. However, since portions of coil windings are used to form the coil inter-turn shield, a relatively more complex coil winding design may be required to compensate for the simpler insulating member design.

The coil winding 123c has a generally rectangular portion 264 like the previous coil windings 123a and 123b in addition to a front flange portion 265. The bottom surface of the rectangular portion 264 is sealingly attached to a top surface 282 of the insulating member 280. A bottom surface 284 of the insulating member 280 is also sealingly attached to the top surface of the coil winding 123d. The top surface of the coil winding 123d is notched to define a recessed surface 278 spaced from a bottom surface 268 of the flange portion 265 of the coil winding 123c to form an opening 260. Therefore, the flange portion 265 overlaps a surface 275 of the coil winding 123d, but a back surface 269 of the flange portion is spaced apart from the surface 275 to form a vertical passageway 277 which is coupled to the opening 260.

The upper portion 279 of the vertical passageway 277 is not within the line of sight of the opening 260. As previously described, because most of sputtered material particles travel in a straight path and in a generally downward direction, very little if any of the deposition material particles will reach the extreme upper portion 279 of the vertical passageway 277. Since very little if any of the deposition material particles will reach the extreme upper portion 279 of the vertical passageway 277, the formation of a complete conducting path of sputtered material can be prevented, averting a short-circuiting of the coil windings 123c and 123d.

Although the passageways described above are illustrated as being closed ended, it is anticipated that in some applications, the passageways may pass completely through to the other side of the insulative shield. For example, the size of the openings and the shape of the passageways may prevent the passage of a substantial amount of plasma or sputtered material even though the passageways are not closed or the insulative members do not completely block the gap between windings. Thus, in alternative embodiments, insulative shield members may be fully or partially spaced from adjacent coil windings or each other.

FIG. 8a shows a cross-sectional view of a coil inter-turn shield 200d in accordance with another embodiment of the present invention. The coil inter-turn shield 200d is similar to the coil inter-turn shield 200 of FIG. 4 in that the coil inter-turn shield 200d is also comprised of a single insulating member 285 attached behind the adjacent coil windings 123a and 123b. However, the insulating member 285 is a flexible sheet made of an insulative material instead of being a rigidly structured piece like the insulating member 201 in FIG. 4. As shown in FIG. 8b, the insulating member 285 has a mesh structure with pores that are small enough to confine the plasma and to reduce the quantity of sputtered material escaping from the channel 122.

An upper portion 288 of the insulating member 285 is sealingly attached to a rear surface 203a of the upper coil winding 123a and a lower portion 289 of the insulating member 285 is sealingly attached to a rear surface 203b of the lower coil winding 123b, with two ends defining an opening 292 in the channel 122. A small pocket 286 is thereby formed behind the rear surface 203a of the coil winding 123a in the interior 287 of the insulating member 285. Another small pocket 284 is formed behind the rear surface 203b of the coil winding 123b in the interior 287 of the insulating member 285. Because of the relatively small opening 292, the pockets 284 and 286 are not within the line of sight of the channel 122. As previously described, because most of sputtered material particles travel in a straight path and in a generally downward direction, very little if any of the deposition material particles will reach the pockets 284 and 286. Since very little if any of the deposition material particles will reach the pockets 284 and 286, the formation of a complete conducting path of sputtered material across the insulating member 285 can be reduced or eliminated.

The formation of a complete conducting path of sputtered material can be further prevented by corrugating the insulating member 285 in accordance with another embodiment of the present invention to have many folds 290 as shown in FIG. 9. Because of these folds 290, it is believed that the corrugated insulating member 285 will be more resistant to the formation of a conducting path across the insulating member 285. Also, instead of having just one insulating member 285, a second insulating member 285 (not shown) can be sealingly attached and offset behind the first insulating member 285 so that the pores of the first insulating member 285 overlap with mesh interstices of the second insulating member. The two overlapping offset insulating members 285 can further prevent the escape of the plasma and the escape of sputtered material through the channel 122.

As best seen in FIGS. 1 and 3, the plasma chamber 100 has a dark space shield ring 130 which provides a ground plane with respect to the target 110 above which is negatively biased. In addition, as explained in greater detail in the aforementioned copending application Ser. No. 08/647,182, the shield ring 130 shields the outer edges of the target from the plasma to reduce sputtering of the target outer edges. The dark space shield 130 performs yet another function in that it is positioned to shield the coil-shield 104 from the material being sputtered from the target 110. The dark space shield 130 does not completely shield the coil-shield 104 from all of the material being sputtered since some of the sputtered material travels at an oblique angle with respect to the vertical axis of the plasma chamber 100. However, because much of the sputtered material does travel parallel to the vertical axis of the chamber or at relatively small oblique angles relative to the vertical axis, the dark space shield 130 which is positioned in an overlapping fashion above the coil-shield 104 can prevent a substantial amount of sputtered material from being deposited on the coil-shield 104. By reducing the amount of material that would otherwise be deposited on the coil-shield 104, the generation of particles by the material which is deposited on the coil-shield 104 can be substantially reduced.

The dark space shield 130 is a generally continuous ring of titanium (where titanium deposition is occurring in the chamber 100) or stainless steel having a generally inverted frusto-conical shape. The dark space shield extends inward toward the center of plasma chamber 100 so as to overlap the coil-shield 104 by a distance of approximately 6 mm (or ¼ inch). It is recognized, of course, that the amount of overlap can be varied depending upon the relative size and placement of the coil and other factors. For example, the overlap may be increased to increase the shielding of the coil-shield 104 from the sputtered material but increasing the overlap could also further shield the target from the plasma which may be undesirable in some applications. Also, as described in copending application Ser. No. 08/856,421 pending entitled "Improved Darkspace Shield for Improved RF Transmission in Inductively Coupled Plasma Sources for Sputter Deposition," (Atty. Docket AM 1389/PVD/DV), the dark space shield ring may have a slot to reduce eddy currents induced in the ring by the overlapping coil-shield 104. The plasma chamber 100 is supported by an adapter ring assembly 152 which engages the vacuum chamber. The dark space shield 130 is grounded through the adapter ring assembly 152.

The target 110 is generally disk-shaped and is also supported by the adapter ring assembly 152. However, the target 110 is negatively biased and therefore should be insulated from the adapter ring assembly 152 which is at ground. Accordingly, seated in a circular channel formed in the underside of the target 110 is a ceramic insulation ring assembly 172 which is also seated in a corresponding channel 174 in the upper side of the adapter ring assembly 152. The insulator ring assembly 172 which may be made of a variety of insulative materials including ceramics spaces the target 110 from the adapter ring assembly 152 so that the target 110 may be adequately negatively biased. The target, adapter and ceramic ring assembly are provided with O-ring sealing surfaces (not shown) to provide a vacuum tight assembly from the vacuum chamber to the target 110.

To promote uniform erosion of the target 110, a magnetron 116 (FIG. 2) may be provided above the target 110. However, the magnetron may be omitted by increasing the RF ionization of the plasma.

It should be recognized that the present invention is applicable to plasma chambers having more than one RF powered coil. For example, the present invention may be applied to multiple coil chambers for launching helicon waves of the type described in copending application Ser. No. 08/559,345 pending. Also, ionization members other than coils may be used.

The appropriate RF generators and matching circuits are components well known to those skilled in the art. For example, an RF generator such as the ENI Genesis series which has the capability to "frequency hunt" for the best frequency match with the matching circuit and antenna is suitable. The frequency of the generator for generating the RF power to the coil-shield 104 is preferably 2 MHz but it is anticipated that the range can vary from, for example, 1 MHz to 100 MHz. An RF power setting of 4.5 kW is preferred but a range of 1.5–5 kW is believed to be satisfactory. In some applications, energy may also be transferred to the plasma by applying AC or DC power to coils and other energy transfer members. A DC power setting for biasing the target 110 of 3 kW is preferred but a range of 2–25 kW is believed to be satisfactory for many applications. Similarly, a pedestal bias voltage of −30 volts DC is satisfactory but may range from −20 to −100 V, for example.

The wafer to target space is preferably about 140 mm but can range from about 40 mm (or 1.5") to approximately 200 mm (or 8"). For this wafer to target spacing, a coil diameter of about 290 mm (or 11½ inches) is preferred. Increasing the diameter of the coil which moves the coil away from the workpiece edge can have an adverse effect on bottom coverage. On the other hand, decreasing the coil diameter to move the coil closer to the wafer edge can adversely affect layer uniformity. It is believed that decreasing the coil diameter will cause the coil to be more closely aligned with the target resulting in substantial deposition of material from the target onto the coil which in turn can adversely affect the uniformity of material being sputtered from the coil.

As set forth above, the relative amounts of material sputtered from the target 110 and the coil-shield 104 are a function of the ratio of the RF power applied to the coil and the DC power applied to the target. However, it is recognized that in some applications, an RF power level which is optimum for improving the uniformity of the deposited layer of materials from the coil and the target may not be optimum for generating a plasma density for ionization. An alternative plasma chamber may have a second target which, although generally shaped like a coil, is not coupled to an RF generator. Instead, the second target may be formed of a flat closed ring coupled through feedthrough standoffs to a variable negative DC bias source. As a consequence, the chamber may have three "targets," the first target 110, the second ring target, and the RF coil-shield 104.

The coil-shield 104 is made of a conductive material such as heavy duty bead blasted solid high-purity (preferably 99.995% pure) titanium formed into a generally cylindrical shape having a diameter of 10–12 inches for an 8 inch wafer. However, other highly conductive materials may be utilized depending upon the material being sputtered and other factors. For example, if the material to be sputtered is aluminum, both the target and the coil-shield 104 may be made of high purity aluminum.

A variety of precursor gases may be utilized to generate the plasma including Ar, $H_2$ or reactive gases such as $NF_3$, $CF_4$ and many others. Various precursor gas pressures are suitable including pressures of 0.1–100 mTorr. For ionized PVD, a pressure between 10 and 50 mTorr is preferred for best ionization of sputtered material.

It will, of course, be understood that modifications of the present invention, in its various aspects, will be apparent to those skilled in the art, some being apparent only after study others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. An apparatus for processing a workpiece, comprising:
   a chamber;
   a holder for said workpiece;
   a plasma generation area adjacent said holder;
   a coil for coupling energy into said plasma generation area to generate a plasma; said coil having a channel defining a plurality of coil windings, said coil windings each including a surface exposed to said plasma generation area; and
   an insulative shield attached to said coil and positioned in alignment with said channel to confine said plasma and to inhibit sputtered material from exiting said channel between adjacent surfaces exposed to said plasma generation area.

2. An apparatus for depositing deposition material onto a workpiece, comprising:
   a chamber;
   a source of deposition material;
   a holder for said workpiece;
   a plasma generation area between said source and said holder;
   a coil for coupling energy into said plasma generation area to generate a plasma to ionize said material; said coil having a channel defining a plurality of coil windings, said coil windings each including a surface exposed to said plasma generation area; and
   an insulative shield positioned in said channel to confine said plasma and to inhibit passage of sputtered material through said channel between adjacent surfaces exposed to said plasma generation area.

3. An apparatus for sputtering material onto a workpiece, comprising:
   a chamber;
   a target disposed in said chamber and formed of said material for sputtering said material from said target;
   a holder for said workpiece;
   a plasma generation area between said target and said holder;
   first and second coil windings for radiating energy into said plasma generation area to generate a plasma to ionize said material, said first and second coil windings defining a channel between said first and second coil windings, said first and second coil windings each including a surface exposed to said plasma generation area; and
   an insulative inter-turn shield positioned at said channel to confine said plasma and to block passage of sputtered material entering said channel between said exposed surfaces of said first and second coil windings.

4. The apparatus of claim 3, wherein said inter-turn shield includes at least one insulating member.

5. The apparatus of claim 4, wherein said inter-turn shield has an upper portion attached to a rear surface of said first coil winding and a lower portion attached to a rear surface of said second coil winding such that a width of said inter-turn shield straddles said channel.

6. The apparatus of claim 5, wherein said inter-turn shield has a cavity and an opening leading into said cavity from said plasma generation area such that a width of said cavity is greater than a width of said opening.

7. The apparatus of claim 6, wherein said cavity defines labyrinthine passageways.

8. The apparatus of claim 7, wherein upper portions and lower portions of said labyrinthine passageways are not within a line of sight of said opening.

9. The apparatus of claim 5, wherein said insulating member is a flexible sheet having a mesh structure with pores.

10. The apparatus of claim 9, wherein said insulating member has a corrugated structure with folds to inhibit a formation of a conducting path of said sputtered material across said insulating member.

11. The apparatus of claim 9, wherein a first pocket is formed between said first coil winding and said insulating member.

12. The apparatus of claim 11, wherein a second pocket is formed between said second coil winding and said insulating member.

13. The apparatus of claim 4, wherein said channel is defined by a bottom surface of said first coil winding and a top surface of said second coil winding and wherein said inter-turn shield has an upper portion attached to a bottom surface of said first coil winding and a lower portion attached to a top surface of said second coil winding.

14. The apparatus of claim 13 wherein the width of said inter-turn shield is substantially equal to the width of said channel.

15. The apparatus of claim 4, wherein said insulating member comprises a ceramic.

16. The apparatus of claim 3, wherein said insulative inter-turn shield includes a first insulating member and a second insulating member.

17. The apparatus of claim 12, wherein said first and second insulating members are disposed within said channel.

18. The apparatus of claim 17, wherein said first insulating member and said second insulating member are assembled together so that an opening and labyrinthian passageways including vertical and horizontal passageways are formed between said first and second insulating members to prevent deposition of a complete path of said sputtered material across said first and second insulating members.

19. The apparatus of claim 18, wherein said opening is formed between said first insulating member and a top surface of said second coil winding.

20. The apparatus of claim 19, wherein said opening is less than or equal to 1.5 mm.

21. The apparatus of claim 3, wherein said first coil winding has a flange portion overlapping but spaced from a portion of said second coil winding.

22. The apparatus of claim 21, wherein said insulative inter-turn shield includes said flange portion, an upper portion and an insulating member disposed between said first and second coil windings.

23. The apparatus of claim 22, wherein labyrinthian passageways are formed between said flange portion and said upper portion to prevent a formation of a complete conducting path of said sputtered material across said first and second coil windings.

24. An apparatus as in claim 3, wherein said insulative inter-turn shield is positioned to prevent sputtered material from exiting said channel.

25. An apparatus as in claim 3, wherein said insulative inter-turn shield is positioned to block sputtered material passing through said channel.

26. A method of processing a semiconductor device, comprising:
  radiating RF energy from a coil to energize a plasma positioned above said device, said coil having windings with a channel between said coil windings, wherein adjacent windings each include a surface exposed to said plasma; and
  confining said plasma to a plasma generation area defined by said coil using an insulative shield spanning at least a portion of said channel to prevent plasma from exiting said plasma generation area though said channel between said surfaces exposed to said plasma.

27. A method of depositing deposition material onto a workpiece, comprising:
  coupling energy from a coil into a plasma generation area to generate a plasma to ionize said material; said coil including surfaces exposed to said plasma generation area, said coil defining a channel between adjacent surfaces exposed to said plasma generation area; and
  inhibiting the passage of sputtered material using an insulative shield attached to said coil and positioned to span said channel.

28. A method as in claim 27, further comprising using said insulative shield to prevent sputtered material from passing through said channel.

29. A method as in claim 27, further comprising using said insulative shield to block sputtered material passing through said channel.

30. A method as in claim 27, wherein said coil includes a plurality of windings and said channel is disposed between adjacent windings, further comprising inhibiting electrical shorting between adjacent coil windings by providing said insulative shield with a cavity shaped to inhibit the accumulation of sputtered material across said shield.

31. A method as in claim 27, further comprising inhibiting electrical shorting across said channel by providing said shield with an opening and an internal surface positioned out of the line of sight of said opening.

32. A method of depositing deposition material onto a workpiece, comprising:
  coupling energy from a coil into a plasma generation area to generate a plasma to ionize said material; said coil defining a channel, said coil including a surface exposed to said plasma generation area adjacent to said channel; and
  blocking sputtered material from exiting said channel adjacent to said exposed surface using an insulative shield positioned in said channel.

33. A method of sputtering material onto a workpiece, comprising:
  radiating energy into a plasma generation area using first and second coil windings to generate a plasma to ionize said material, said first and second coil windings defining a channel between said first and second coil windings, said first and second coil windings each having a surface exposed to said plasma adjacent to said channel; and
  inhibiting the passage of sputtered material entering said channel between said exposed surfaces of said first and second coil windings using an insulative inter-turn shield positioned at said channel.

34. An apparatus for depositing deposition material on a workpiece, comprising:
  a deposition chamber having a wall surface and an ionization region therein;
  an ionization member extending at least partially about said ionization region, said ionization member separating said wall surface and said ionization region, said ionization member including surfaces exposed to said ionization region separated by at least one gap therethrough extending at least partially about said ionization region; and
  an insulative member spanning said gap between said surfaces.

35. An apparatus for sputtering conductive material onto a workpiece, comprising:
  a chamber;
  a target disposed in said chamber and formed of said conductive material for sputtering said material from said target;
  a holder for said workpiece;
  a plasma generation area between said target and said holder;
  first and second coil windings for radiating energy into said plasma generation area to generate a plasma to ionize said material, said first and second coil windings defining a channel region between said first and second coil windings; and an insulative inter-turn shield positioned at said channel region to inhibit passage of sputtered material, said shield defining a cavity having an opening and an internal surface positioned out of line of sight of said opening.

36. An apparatus as in claim 35, wherein said cavity extends at least the length of said channel.

37. An apparatus as in claim 35, wherein the width of said inter-turn shield is substantially equal to the width of said channel.

38. An apparatus for sputtering conductive material onto a workpiece, comprising:

a chamber;

a target disposed in said chamber and formed of said conductive material for sputtering said material from said target;

a holder for said workpiece;

a plasma generation area between said target and said holder;

coil means including first and second coil windings for radiating energy into said plasma generation area to generate a plasma to ionize said material, said coil means defining a channel region between said first and second windings; and shield means positioned at said channel region to block passage of sputtered material, said shield means including cavity means for inhibiting the deposition of a layer of conductive material across said shield sufficient to electrically short said first and second coil windings.

* * * * *